US007734981B2

(12) United States Patent
Esumi et al.

(10) Patent No.: US 7,734,981 B2
(45) Date of Patent: Jun. 8, 2010

(54) SIGNAL DECODER, A SIGNAL DECODING METHOD AND A STORAGE SYSTEM

(75) Inventors: Atsushi Esumi, Kyoto (JP); Hidemichi Mizuno, Musashimurayama (JP)

(73) Assignee: Rohm Co., Ltd. (JP)

( * ) Notice: Subject to any disclaimer, the term of this patent is extended or adjusted under 35 U.S.C. 154(b) by 926 days.

(21) Appl. No.: 11/524,173

(22) Filed: Sep. 20, 2006

(65) Prior Publication Data

US 2007/0290908 A1 Dec. 20, 2007

(30) Foreign Application Priority Data

Sep. 22, 2005 (JP) ............................ 2005-276698

(51) Int. Cl.
*H03M 13/00* (2006.01)

(52) U.S. Cl. ................... 714/752; 714/786; 375/240.27

(58) Field of Classification Search ................. 714/752, 714/786; 375/240.27
See application file for complete search history.

(56) References Cited

U.S. PATENT DOCUMENTS

| | | | | |
|---|---|---|---|---|
| 6,757,122 | B1 * | 6/2004 | Kuznetsov et al. | 360/53 |
| 6,933,865 | B1 * | 8/2005 | Kuznetsov et al. | 341/59 |
| 6,956,508 | B2 * | 10/2005 | Han et al. | 341/50 |
| 7,031,090 | B2 * | 4/2006 | Ichihara et al. | 360/65 |
| 7,107,512 | B2 * | 9/2006 | Cameron | 714/794 |
| 7,146,545 | B2 * | 12/2006 | Ohbuchi et al. | 714/701 |
| 7,187,717 | B2 * | 3/2007 | Brossier et al. | 375/260 |
| 7,319,726 | B1 * | 1/2008 | Wu et al. | 375/342 |
| 7,359,426 | B2 * | 4/2008 | Ojard | 375/130 |
| 7,434,136 | B2 * | 10/2008 | Ichihara et al. | 714/755 |
| 7,590,929 | B2 * | 9/2009 | Morita et al. | 714/800 |
| 2004/0205446 | A1 * | 10/2004 | Yamagishi | 714/792 |

FOREIGN PATENT DOCUMENTS

| | | |
|---|---|---|
| JP | 2000-187948 A | 7/2000 |
| JP | 2000-209140 | 7/2000 |
| JP | 2000-353965 A | 12/2000 |
| JP | 2001-266508 A | 9/2001 |
| JP | 2002-367296 | 12/2002 |

(Continued)

OTHER PUBLICATIONS

Japanese Office Action for Japanese Patent Application No. 2005-276698 dispatched Mar. 31, 2009 with English translation.

(Continued)

*Primary Examiner*—Esaw T Abraham
(74) *Attorney, Agent, or Firm*—Cantor Colburn LLP

(57) ABSTRACT

An LDPC iteration decoder includes a second interleaver for performing interleave processing on a signal series outputted from a soft output detection unit, an LDPC decoder for implementing LDPC decoding processing on a signal that has undergone interleave processing; a checking unit for checking that an error has been corrected by the LDPC decoder; a second de-interleaver for performing sort processing the reverse of the second interleaver on a signal that has been LDPC decoded; a judging unit for judging whether to carry out iteration processing again; and a DAE for computing a likelihood again, in cases in which iteration decoding is carried out, and giving feedback to the front stage of the second interleaver.

5 Claims, 5 Drawing Sheets

322
354
SECOND DE-INTERLEAVER
352
350
SECOND INTERLEAVER
358
JUDGING UNIT
356
CHECKING UNIT
LDPC DECODER
320
SOFT OUTPUT DETECTION UNIT
H
SORTING PATTERN
360
DAE

FOREIGN PATENT DOCUMENTS

| | | | |
|---|---|---|---|
| JP | 2004-14057 | A | 1/2004 |
| JP | 2004-164767 | A | 6/2004 |
| JP | 2004-179889 | A | 6/2004 |

OTHER PUBLICATIONS

Japanese Notification of Reason(s) for Refusal for Japanese Patent Application No. 2005-276698 dispatched Jun. 24, 2008 with English Translation.

"Application of Law Density Parity Check Code and Iterative Decoding to Magnetic Recording System", IEICE Technical Report, Japan, Dec. 2002, vol. 102, No. 499, p. 13-18.

Japanese Office Action for Japanese Patent Application No. 2005-276698 dated Sep. 30, 2008 with English Translation.

Japanese Office Action for Japanese Patent Application No. 2005-276698 dispatched Jan. 6, 2009 with English Translation.

* cited by examiner

FIG.5

$$H = \begin{pmatrix} & 1 & & 0 & & 1 & \\ & 0 & & 1 & & 1 & \\ \cdots & 1 & \cdots & 0 & \cdots & 1 & \cdots \\ & 1 & & 1 & & 0 & \\ & 0 & & 1 & & 1 & \end{pmatrix}$$

$$\Downarrow \quad \Downarrow \quad \Downarrow$$

$$\vec{a} \quad \vec{b} \quad \vec{c}$$

$$\vec{a} \oplus \vec{b} \oplus \vec{c} = \vec{0}$$

SIGNAL DECODER, A SIGNAL DECODING METHOD AND A STORAGE SYSTEM

BACKGROUND OF THE INVENTION

1. Field of the Invention

The present invention relates to technology for accessing storage media, and in particular, to a signal decoder, a signal decoding method and a storage system.

2. Description of the Related Art

In recent years, storage devices using hard disks are becoming essential devices in various fields, such as those of personal computers, hard disk recorders, video cameras, mobile telephones, and the like. Various specifications are required for the storage devices using hard disks, according to fields of application; for example, when used in personal computers, high speed and large capacity are required. However, since the amount of data to be handled increases as the capacity is enlarged, correction of generated errors by error correction processing becomes a bottleneck for realizing high speed.

Conventionally, Reed-Solomon encoding, turbo encoding, low density parity check encoding, and the like, are used as error correction methods employed in storage devices using hard disks. Common to all of these error correction encoding methods is the fact that they are strong with regard to randomly generated errors, but are weak with regard to errors generated in groups. For example, when data of 10,000 bits is composed of 10 blocks of code words, that is, when each code word is 1000 bits, with 100 bit burst errors, there is a tendency for errors in certain code words. In these types of cases, even if error correction decoding is carried out, errors cannot be corrected. Thus, additional processing of re-reading, re-decoding, and the like, occurs, and as a result, there is an effect on reading speed. As a method of improving this, carrying out interleaving may be considered. Since interleaving is composed of processing for interchanging data order, an effect is realized of dispersing errors occurring in groups, and changing them into random errors (for example, refer to Patent Document 1).

Patent Document 1: Japanese Patent Application, Laid Open No. 2002-367296

In view of these conditions, the inventors came to recognize the following problem. That is, when interleaving is carried out, it is necessary to decide in advance in what way data series are sorted, and since it is necessary to perform interleaving for each of writing to and reading from the storage device, there is a problem in that it is difficult to adaptably change sorting rules.

SUMMARY OF THE INVENTION

The present invention has been made taking this situation into account and a general purpose is to provide a storage device in which access can be carried out at higher speeds.

In order to solve the above problems, in an aspect of the present invention, a signal decoder includes an interleaving circuit for sorting an order of an input signal series of a prescribed number of signals; a low density parity check decoder for performing low density parity check decoding on the signal series sorted by the interleaving circuit; and a de-interleaving circuit for sorting an order of signals outputted from the low density parity check decoder; wherein a sorting rule for the interleaving circuit is decided based on an error generation model of the input signal series. The sorting rule may be decided in consideration of, among the input signal series, localization of continuously generated errors in a prescribed interval. Furthermore, the sorting rule may be decided so that a signal included in the input signal series is separated from another adjacent signal only, with respect to an interval longer than the prescribed interval.

According to this aspect, by sorting places where errors are concentrated, signals in which errors are included can be dispersed, and it is possible to improve error correction ability of the low density parity check decoder.

Here, "sorting into a plurality of processing paths" includes respectively sorting the input signal series into two or more output terminals. Furthermore, a "prescribed matrix" may be a matrix that is decided in advance, or may be a matrix that changes dynamically. "Making the prescribed matrix operate on a signal" includes multiplication processing of a signal by a matrix. An operation is also possible with the result of transposing a matrix, or obtaining an inverse matrix. The "error generation model" may relate to an error originating in a signal encoder, or may relate to an error originating in a device including the signal encoder or the like. "Error localization" includes a tendency for the existence of errors that are concentrated in some portion of the signal series. Furthermore, the "sorting rule" includes a rule for sorting the order of the input signal series.

Another aspect of the present invention also relates to a signal decoder. This decoder includes: an interleaving circuit for sorting an order of an input signal series of a prescribed number of signals; a low density parity check decoder for performing low density parity check decoding, using a prescribed matrix, of the signal series sorted by the interleaving circuit; and a de-interleaving circuit for sorting an order of signals outputted from the low density parity check decoder; wherein the prescribed matrix is a matrix for checking a low density parity series, and a logical sum of elements of M columns (M being an integer greater than or equal to 2) included in the matrix is a zero matrix. Furthermore, the interleaving circuit has an increased number of processing paths, and by sorting the input signal series, the number M is decreased. In addition, the interleaving circuit sorts at least one signal, by interchanging with another signal, among the signals acted upon relating to respective columns, with a logical sum of the M columns (M being an integer greater than or equal to 2) being a zero matrix, by the low density parity check decoder.

According to this aspect, by sorting places where errors are concentrated, signals in which errors are included can be dispersed, and it is possible to improve error correction ability of the low density parity check decoder. Furthermore, by changing the order of the signal series, it is possible to allow a prescribed matrix to include a plurality of columns that are linearly dependent. In other words, it is possible to improve the error correction ability, without depending on characteristics of the prescribed matrix.

Here, "logical sum" may be, among logic operations, a logical sum operation, or may be an exclusive-OR operation. The "logical sum of elements of M columns (M being an integer greater than or equal to 2) is a zero matrix" refers to columns that have a mutually linearly independent relationship, and with a logical sum operation performed in each row, for a plurality of elements included in the respective M columns, a matrix is obtained that includes only elements in which the result of the operation is 0. "Interchanging at least one signal with another signal, among signals acted upon corresponding to respective columns in a matrix in which a logical sum of elements in the M columns (M being an integer greater than or equal to 2) form a zero matrix" includes, among signal series acted upon by a prescribed matrix, interchanging positions with the signal acted upon by the M columns for which the logical sum is 0, and signals acted upon by any other of a plurality of columns for which the logical sum is not 0. Furthermore, a "processing path" includes an output path of the interleaving circuit.

Another aspect of the present invention concerns a storage system. This signal storage system has a write channel for writing data to a storage device, and a read channel for reading data stored in the storage device, wherein the write channel comprises: a first encoder for run-length encoding of data; a second encoder for encoding data encoded by the first encoder, using a low density parity check code; and a writing unit for writing the data encoded by the second encoder, to the storage device; the read channel comprises: a soft output detecting unit for calculating likelihood for data read from the storage unit and outputting a soft decision value; a first decoder, corresponding to the second encoder, for decoding the data outputted from the soft output detection unit; and a second decoder, corresponding to the first encoder, for decoding the data decoded by the second decoder; the first decoder comprises: an interleaving circuit for sorting an order of the data outputted from the soft output detection unit; a low density parity check decoder for performing low density parity check decoding on a signal series sorted by the interleaving circuit; and a de-interleaving circuit for sorting an order of a signal outputted from the low density parity check decoder; and a rule for sorting in the interleaving circuit is decided based on a model of error generation in the data outputted from the soft output detection unit.

According to this aspect, by sorting places where errors are concentrated, signals in which errors are included can be dispersed, and it is possible to improve error correction ability when decoding. Furthermore, it is possible to realize access control of the storage system at higher speeds.

A further aspect of the present invention concerns a storage system. The storage system further includes: a storage device for storing data; and a controller for controlling writing to the storage device and reading from the storage device; wherein the read channel, in accordance with an instruction of the controller, reads data stored in the storage device, and the write channel, in accordance with an instruction of the controller, writes the encoded data to the storage device.

According to this aspect, by sorting places where errors are concentrated, signals in which errors are included can be dispersed, and it is possible to improve error correction ability when decoding. Furthermore, it is possible to realize access control of the storage system at higher speeds.

A further aspect of the present invention relates to a semiconductor integrated circuit. A signal storage system having a write channel for writing data to a storage device, and a read channel for reading data stored in the storage device, wherein the write channel comprises: a first encoder for run-length encoding of data; a second encoder for encoding data encoded by the first encoder, using a low density parity check code; and a writing unit for writing the data encoded by the second encoder, to the storage device; the read channel comprises: a soft output detection unit for calculating likelihood for data read from the storage unit and outputting a soft decision value; a first decoder, corresponding to the second encoder, for decoding the data outputted from the soft output detection unit; and a second decoder, corresponding to the first encoder, for decoding the data decoded by the second decoder; the first decoder includes: an interleaving circuit for sorting an order of the data outputted from the soft output detection unit; a low density parity check decoder for performing low density parity check decoding on a signal series sorted by the interleaving circuit; and a de-interleaving circuit for sorting an order of a signal outputted from the low density parity check decoder. Based on a model of errors generated in the data outputted from the soft output detection unit, the sorting rule for the interleaving circuit is decided; the write channel, according to an instruction of the controller, writes prescribed data to the storage device; and the read channel, according to an instruction of the controller, reads the prescribed data from the storage device.

According to this aspect, by sorting places where errors are concentrated, signals in which errors are included can be dispersed, and it is possible to improve error correction ability when decoding. Since it is not necessary to install extra hardware, a small-scale semiconductor integrated circuit can be realized.

Another aspect of the present invention relates to a signal decoding method. The device includes: a first sorting step of sorting an order of an input signal series of a prescribed number of signals; a low density parity check decoding step of performing low density parity check decoding on the signal series sorted in the first sorting step; and a second sorting step of sorting an order of signals outputted from the low density parity check decoding step; wherein a sorting rule in the first sorting step is decided based on a model of error generation in the input signal series.

According to this aspect, by sorting places where errors are concentrated, signals in which errors are included can be dispersed, and it is possible to improve error correction ability when decoding. Furthermore, it is possible to realize access control of the storage system at higher speeds.

Another aspect of the present invention relates to a signal decoding method. The device includes: a first sorting step of sorting an order of an input signal series of prescribed number of signals; a low density parity check decoding step of performing low density parity check decoding, using a prescribed matrix, on the signal series sorted by the first sorting step; and a second sorting step of sorting an order of signals outputted from the low density parity check decoding step; wherein the prescribed matrix is a matrix for checking a low density parity series, and a logical sum of elements of M columns (M being an integer greater than or equal to 2) included in the matrix gives a zero matrix.

According to this aspect, by sorting places where errors are concentrated, signals in which errors are included can be dispersed, and it is possible to improve error correction ability of the low density parity check decoder. Furthermore, by changing the order of the signal series, it is possible to allow a prescribed matrix to include a plurality of columns that are linearly dependent. In other words, it is possible to improve the error correction ability, without depending on characteristics of the prescribed matrix.

Furthermore, optional combinations of the above component elements, and interchanging of the component elements and representation between methods, devices, and system are valid modes of the invention.

BRIEF DESCRIPTION OF THE DRAWINGS

FIG. 5. is a view showing an example of a case in which a matrix H related to the embodiment of the present invention has a linearly dependent relationship.

DETAILED DESCRIPTION OF THE INVENTION

Figure 1:
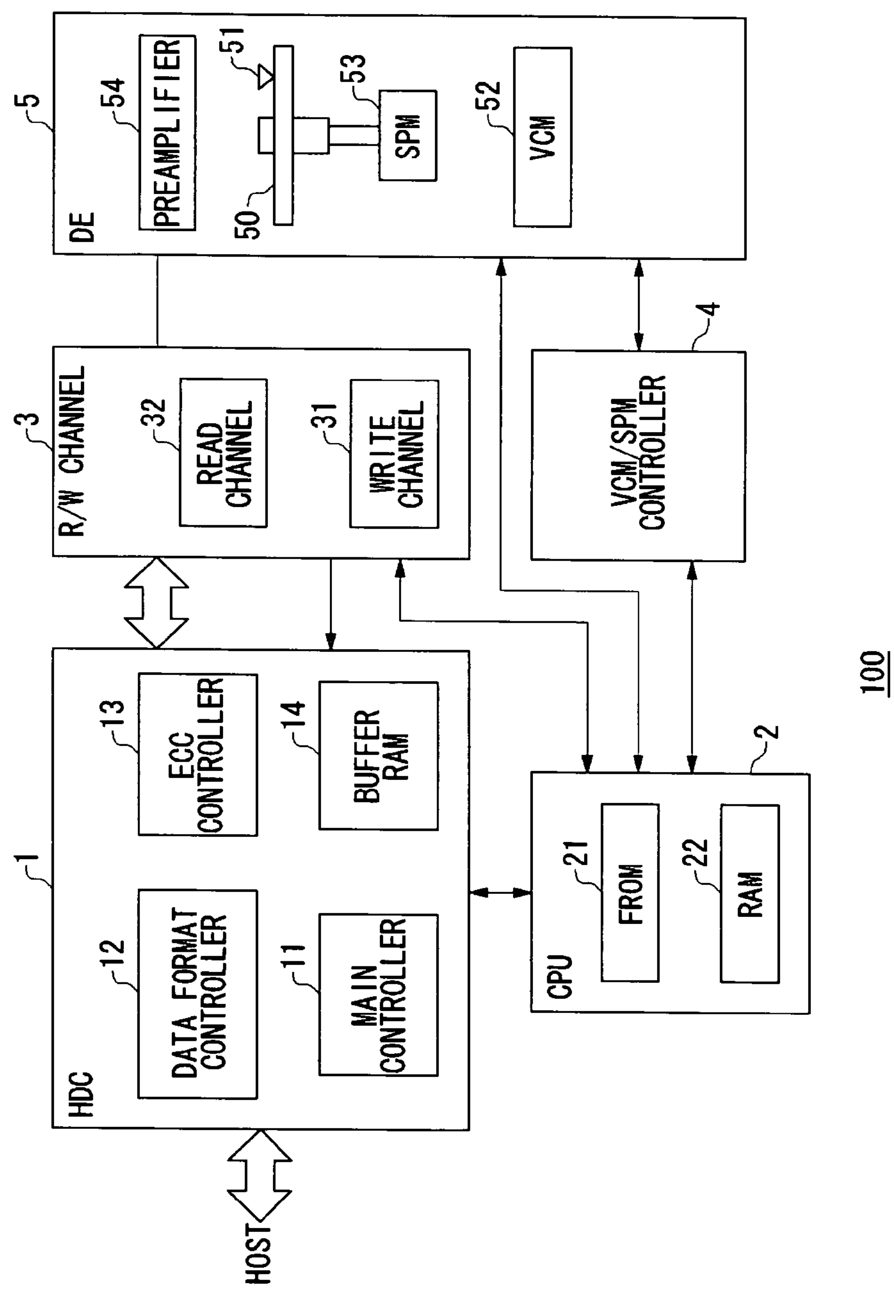
FIG. 1 is a view showing a configuration of a magnetic disk device related to a first embodiment of the present invention.

The invention will now be described by reference to the preferred embodiments. This does not intend to limit the scope of the present invention, but to exemplify the invention.

Below, an explanation concerning embodiments of the present invention (referred to as "embodiments" below) will be given, making reference to the drawings.

EMBODIMENT

Before giving a specific explanation of the present invention, first an outline of a storage device related to the present embodiment will be described. The storage device related to the present embodiment has a hard disk controller, a magnetic disk device, and a read-write channel including a read channel and a write channel. In the read channel, LDPC decoding using a check matrix H is carried out. This LDPC decoding has a characteristic of being weak towards errors that are generated together in a burst (abbreviated to "burst errors" below.) These burst errors are known to be generated not only due to physical problems inside the storage device, but also due to a soft output detection unit. Furthermore, the burst errors are localized, and have a tendency to be generated locally at a constant frequency.

Here, the check matrix H used in the LDPC decoding is a matrix in which elements of the matrix are either 0 or 1, and has a characteristic in that the number of 0s is very large in comparison to the number of 1s. In general, the check matrix H is created so as not to include columns having a linearly dependent relationship. However, since the number of 1s is low, and a balance of 0s and is not possible, the matrix H often ends up including a linearly dependent relationship. In cases where data corresponding to columns with a linearly dependent relationship has respective burst errors, even if decoding is iteration with LDPC decoding, errors cannot be corrected. Details are described below, but, for example, in cases in which there are three columns with linearly dependent relationships, among three groups of data corresponding to the respective columns, if there are errors in two of the data groups, corrections can be done by LDPC decoding. However, if there are errors in all three data groups, it is not possible to make a correction.

Therefore, in an embodiment of the present invention, without making any refinement to the check matrix H, but rather by making a refinement to an order of a data series, problems of the abovementioned linear dependency and the burst errors are solved at the same time. In the present invention, by sorting places in which errors are concentrated, details of which are described below, signals including errors can be dispersed. A sorting method is performed considering localization of the burst errors, or linear dependency of the check matrix H. Furthermore, error correction ability when decoding can be improved. In addition, by changing the order of the signal series, it is possible to allow a prescribed matrix to include a plurality of columns that are linearly dependent. In other words, it is possible to improve the error correction ability, without depending on characteristics of the prescribed matrix.

Moreover, in general, a generated matrix with respect to LDPC encoding or LDPC decoding is described as G, and the check matrix as H. In order to simplify explanations here, both of these are explained as a prescribed matrix, or as a matrix H. Furthermore, since the generated matrix G has a relationship according to Equation (1) with the check matrix H, if one matrix is decided then the other is also decided.

$$G \times H^T = 0 \quad \text{Equation (1)}$$

Here, $H^T$ is a transposed matrix of H. Furthermore, 0 on the right hand side indicates a zero matrix.

Below, the embodiment of the present invention is explained in detail using the drawings.

FIG. 1 is a view showing a configuration of a magnetic disk device 100 related to a first embodiment of the present invention. The magnetic disk device 100 of FIG. 1 includes a hard disk controller 1 (below, abbreviated to HDC 1), a central processing unit 2 (below, abbreviated to CPU 2), a read-write channel 3 (below, abbreviated to R/W channel 3), a voice coil motor/spindle motor controller 4 (below, abbreviated to VCM/SPM controller 4), and a disk enclosure 5 (below, abbreviated to DE 5). In general, the HDC 1, the CPU 2, the R/W channel 3, and the VCM/SPM controller 4 are configured on a same board.

The HDC 1 includes a main controller 11 for controlling the whole HDC 1, a data format controller 12, an error correction encoding controller 13 (below, abbreviated to ECC controller 13), and a buffer RAM 14. The HCD 1 is connected to a host system via an interface unit, not shown in the figure, and, in addition, is connected to the DE 5, via the R/W channel 3, and transfers data between the host and the DE 5, by control of the main controller 11. A read reference clock (RRCK) generated by the R/W channel 3 is input to this HDC 1. The data format controller 12 converts data transferred from the host into a format suitable for recording on the disk media 50, and conversely, converts data reproduced from the disk media 50 into a format suitable for transferring to the host. The disk media 50 includes, for example, a magnetic disk. In order to enable correction and detection of errors included in the data reproduced from the disk media 50, the ECC controller 13 adds redundant symbols, with recorded data as information symbols. Furthermore, the ECC controller 13 judges whether an error has occurred in the reproduced data, and when there is an error, correction or detection is carried out. However, the number of symbols that can correct errors is limited, and is related to length of the redundant data. More specifically, since formatting efficiency deteriorates if much redundant data is added, there is a trade-off with the number of possible symbols for error correction. In cases in which Reed-Solomon (RS) code is used as the ECC to perform error correction, up to ((number of redundant symbols)/2) errors can be corrected. The buffer RAM 14 temporarily stores data transferred from the host, and transfers the data with suitable timing to the R/W channel 3; and conversely, temporarily stores read data transferred from the R/W channel 3, and after completion of the ECC decoding processing, transfers the data with suitable timing to the host.

The CPU 2 includes a flash ROM 21 (below, abbreviated to FROM 21), and a RAM 22, and is connected to the HDC 1, the R/W channel 3, the VCM/SPM controller 4, and the DE 5. An operational program of the CPU 2 is stored in the FROM 21.

The R/W channel 3 includes a write channel 31 and a read channel 32, and performs transfer of recorded data and reproduced data with the HDC 1. Furthermore, the R/W channel 3 is connected to the DE 5, and performs transmission of recorded signals and receipt of reproduced signals. Details are described below.

The VCM/SPM controller 4 controls a voice coil motor 52 (below, abbreviated to VCM 52) inside the DE 5 and a spindle motor 53 (below, abbreviated to SPM 53).

The DE 5 is connected to the R/W channel 3, and performs reception of a recorded signal and transmission of a reproduced signal. Furthermore, the DE 5 is connected to the VCM/SPM controller 4. The DE 5 includes the disk media 50, a head 51, the VCM 52, the SPM 53, and a preamplifier 54. In the magnetic disk device 100 of FIG. 1, it is assumed that there is one of the disk media 50, and that the head 51 is arranged on one side only of the disk media 50; however, the configuration may also have a plurality of disk media 50 arranged in a stack. Moreover, in general, the head 51 is arranged to correspond to each side of the disk media 50. The recorded signal transmitted by the R/W channel 3 is supplied via the preamplifier 54 inside the DE 5 to the head 51, and is recorded on the disk media 50 by the head 51. Conversely, a signal reproduced from the disk media 50 by the head 51 is transmitted via the preamplifier 54 to the R/W channel 3. In order to position the head 51 at a target position on the disk media 50, the VCM 52 inside the DE 5 moves the head 51 in a radial direction of the disk media 50. In addition, the SPM 53 rotates the disk media 50.

Figure 2:
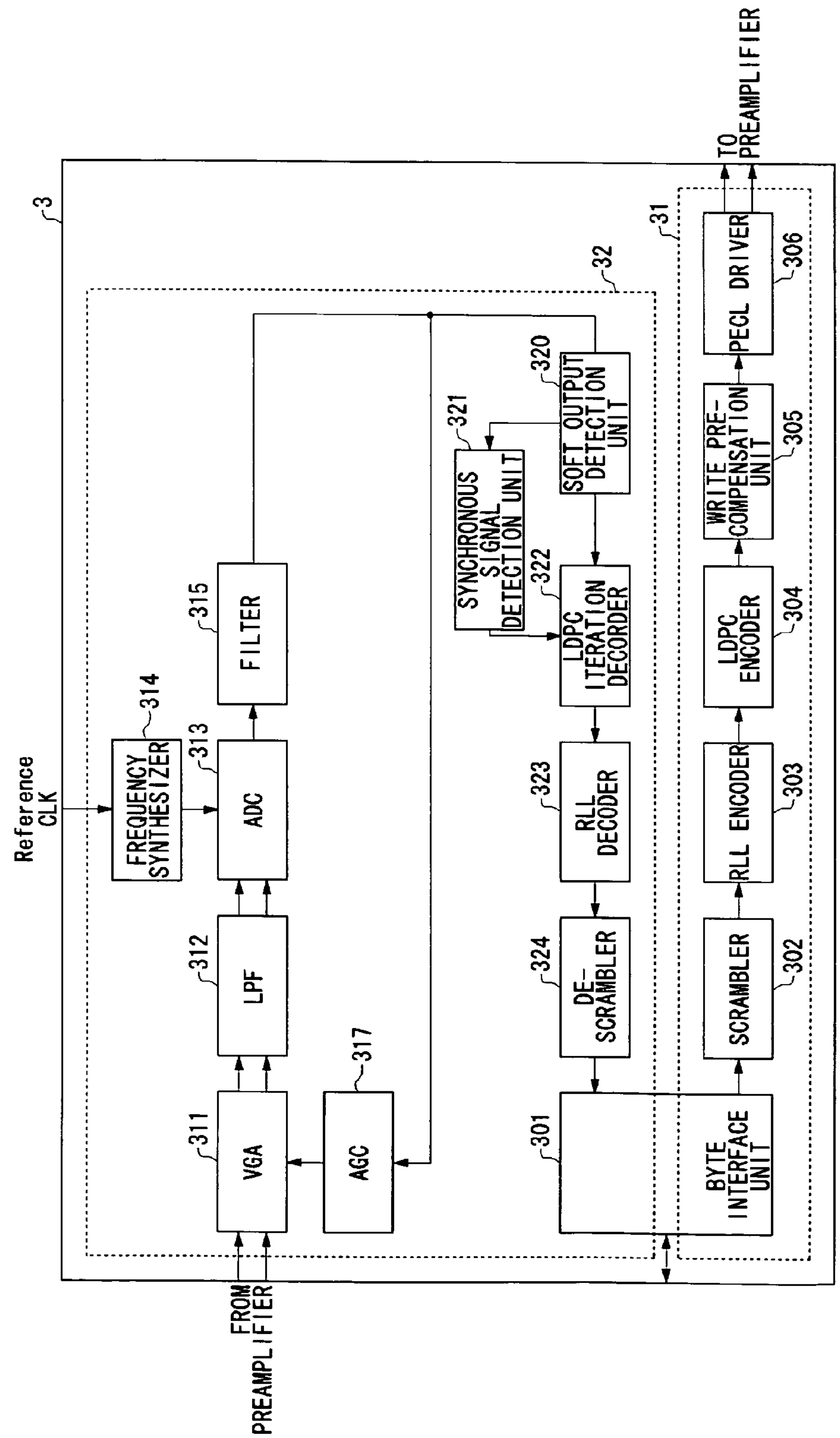
FIG. 2. is a view of a configuration of a read/write channel of FIG. 1.

Here, the R/W channel 3 is explained, using FIG. 2. FIG. 2 shows a configuration of the R/W channel 3 of FIG. 1. The R/W channel 3 includes a write channel 31 and a read channel 32.

The write channel 31 includes a byte interface unit 301, a scrambler 302, a run-length control encoder 303 (below, abbreviated to RLL encoder 303), a low density parity check encoder 304 (below, abbreviated to LDPC encoder 304), a write compensation unit 305 (below, described as a write pre-compensation unit 305), and a driver 306.

The byte interface unit 301 processes, as input data, data transmitted from the HDC 1. Data to be written on the media is input from the HDC 1 in one sector units. At this time, not only user data for one sector (512 bytes), but also ECC bytes added by the HDC 1 are inputted at the same time. A data bus is usually one byte (8 bits), and processing is carried out for data input by the byte interface unit 301. The scrambler 302 converts write data into a random series. This is to prevent iteration of the same data rule that adversely affects detection performance at read time and causes deterioration in error rate. The RLL encoder 303 has a role of limiting the maximum continuous length of 0s. By limiting the maximum continuous length of 0s, a data series is formed that is suitable for an automatic gain control unit 317 (below, abbreviated to AGC 317) or the like, at read time.

The LDPC encoder 304 has a role of LDPC-encoding the data series, to generate a series including parity bits that are redundant bits. The LDPC encoding is performed by multiplying, from the left, a data series of length k, by a k×n matrix called a generated matrix. Each element included in the check matrix H corresponding to this generated matrix is 0 or 1, and since the number of is low in comparison to the number of 0s, it is called Low Density Parity Check Code. By using this arrangement of 1s and 0s, correction of errors can be performed efficiently in the LDPC iteration decoder 322, described below. Details are given below.

The write pre-compensation unit 305 is a circuit for compensating for non-linear distortion due to continuous magnetic transition on the media. A rule necessary for compensation is detected from the write data, and a write electrical current waveform is adjusted in advance so that the magnetic transition occurs at a correct position. The driver 306 is a driver for outputting a signal corresponding to a pseudo ECL level. Output from the driver 306 is sent to the DE 5, not illustrated in the figure, and sent through the preamplifier 54 to the head 51, and the write data is recorded on the disk media 50.

The read channel 32 is configured from a variable gain amplifier 311 (below, abbreviated to VGA 311), a low-pass filter 312 (below, abbreviated to LPF 312), the AGC 317, a digital/analog converter 313 (below, abbreviated to ADC 313), a frequency synthesizer 314, a filter 315, a soft output detection unit 320, an LDPC iteration decoder 322, a synchronous signal detector 321, a run-length control decoder 323 (below, abbreviated to RLL decoder 323), and a descrambler 324.

The VGA 311 and the AGC 317 perform adjustment of the amplitude of a read waveform of data send from the preamplifier 54, not shown in the figure. The AGC 317 compares the actual amplitude with an ideal amplitude, and determines gain to be set in the VGA 311. The LPF 312 can adjust cutoff frequency and boost amount, and handles part of equalization of partial response waveform (below, abbreviated to PR) and reduction of high frequency wave noise. In the LPF 312, equalization of the PR waveform is carried out, but complete equalization by analog LPF is difficult due to many causes, such as variation in amount by which the head rises, non-uniformity of media, variation in rotation of motor, and the like, and the filter 315, disposed at a rear stage and having more flexibility, is used, and performs equalization of the PR waveform again. The filter 315 has a function of adaptively adjusting a tap coefficient thereof. The frequency synthesizer 314 generates a sampling clock for the ADC 313. The ADC 313 has a configuration to obtain a direct synchronous sample by AD conversion. In addition to this configuration, the configuration may obtain an asynchronous sample by the AD conversion. In such cases, a zero phase restart unit, a timing controller, and an interpolation filter may be further arranged at the rear stage of the ADC 313. It is necessary to obtain a synchronous sample from the non-synchronous sample, and these blocks have a role of doing this. The zero phase restart unit is a block for determining an initial phase, and is used to obtain the synchronous sample as early as possible. After deciding the initial phase, an actual sample value and an ideal sample value are compared by a timing controller, and phase lag is detected. By using this to decide a parameter of the interpolation filter, the synchronous sample can be obtained.

The soft output detection unit 320 uses a soft output Viterbi Algorithm (abbreviated to "SOVA" below) to avoid deterioration of decoding characteristic that accompanies intersymbol interference. That is, with the increase in recording density of magnetic disk devices in recent years, interference between recorded code has increased, and in order to solve the problem of deterioration of decoding characteristic, a maximum-likelihood decoding (Partial Response Maximum Likelihood; abbreviated to PRML below) system, using partial response due to interference between code, is used as a system to overcome this. The PRML is a system for obtaining a signal series that maximizes likelihood of a partial response of reproduced signals. Details are described below.

The LDPC iteration decoder 322 has a role of restoring from the data series that is LDPC-encoded, to a series before the LDPC encoding. Methods of decoding include, principally, a sum-product decoding method, and a min-sum decoding method; from the view of decoding performance, the sum-product decoding method is advantageous, but the min-sum decoding method has a characteristic in that it can be realized easily by hardware. In actual decoding operations using LDPC encoding, by performing iteration decoding between the soft output detection unit 320 and the LDPC iteration decoder 322, very good decoding performance can be obtained. Therefore, in actuality, a configuration is necessary in which the soft output detection unit 320 and the LDPC iteration decoder 322 are arrayed in a plurality of stages. Details are described below.

The synchronous signal detection unit 321 detects a synchronous signal (sync mark) added to the head of the data, and has a role of recognizing the head position of the data. The RLL decoder 323 performs an operation the reverse of the RLL encoder 303 of the write channel 31, on data outputted from the LDPC iteration decoder 322, to return the original data series. The de-scrambler 324 performs an operation the reverse of the scrambler 302 of the write channel 31, to return the original data series. The data generated here is transmitted to the HDC 1.

Figure 3:
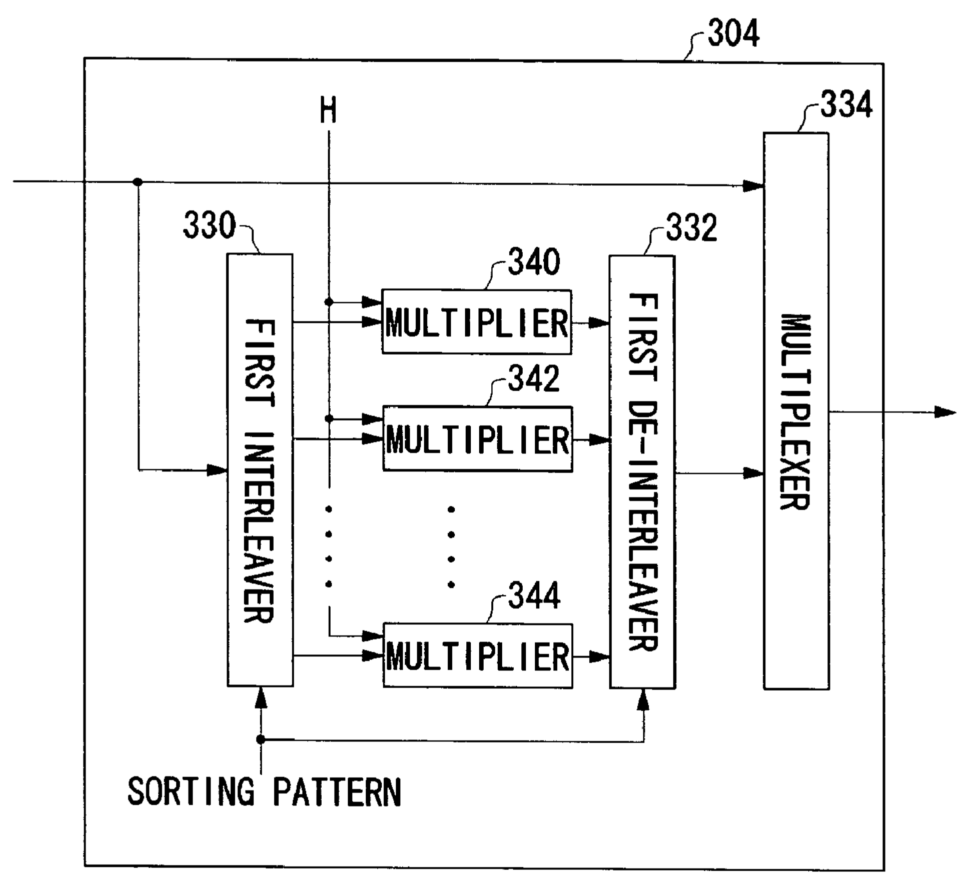
FIG. 3. is a view showing a configuration of the LDPC encoder of FIG. 2.

The LDPC encoder 304 is explained here. FIG. 3 is a view showing a configuration of the LDPC encoder 304 of FIG. 2. The LDPC encoder 304 includes a first interleaver 330 for performing interleave processing on the input signal series; multipliers 340 to 344 (abbreviated to representative "multiplier 340" below) for performing multiplication of the respectively interleaved signal series by the H matrix; a first de-interleaver 332 for performing sort processing the reverse of the first interleaver 330, and for generating parity bits; and a multiplexer 334 for combining the input signal series and the parity bits.

The first interleaver 330 sorts the signal series that has been inputted into a plurality of series, and outputs the series to the multipliers 340 to 344, respectively. This sorting is according to a sorting rule (interleaving pattern) inputted from the outside, and the number of processing paths. For example, in cases where the sorting rule is (0, 1, 2, 3, 4, 5, 6, 7), and the signal series are inputted in the order of d0, d1 to d7, the signal series are sorted as in Equation (2).

(d0, d1, d2, d3, d4, d5, d6, d7) Equation (2)

Here, in cases in which the number of processing paths is two, that is, the number of multipliers is two, for example, the multiplier 340 and the multiplier 342, output is as follows:

Input series of multiplier 340: (d0, d2, d4, d6)

Input series of multiplier 342: (d1, d3, d5, d7)

That is, the signals shown in Equation (2) are input to the same multiplier every second one, two being the number of multipliers.

An explanation will be given using another example. For example, in cases where the sorting rule is (0, 4, 1, 5, 2, 6, 3, 7), and the signal series is inputted in the order of d0, d1 to d8, the signal series are sorted as in Equation (3).

(d0, d4, d1, d5, d2, d6, d3, d7) Equation (3)

Here, in cases in which the number of processing paths it two, that is, the number of multipliers is two, for example, the multiplier 340 and the multiplier 342, output is as follows:

Input series of multiplier 340: (d0, d1, d2, d3)

Input series of multiplier 342: (d4, d5, d6, d7)

That is, the signal series shown in Equation (3) are inputted to the same multiplier every second multiplier, two being the number of multipliers.

The multiplier 340 is provided at each processing path, and makes the matrix H, that is inputted from the outside, to act on signals outputted from the first interleaver 330. That is, multiplication of the signals outputted from the first interleaver 330 and each element of the matrix is performed. Specifically, a computation expressed in Equation (4) is performed.

$$D_i \times H = C_i \qquad \text{Equation (4)}$$

Here $D_i$ is a 1×k matrix, and describes the signal series inputted to each multiplier 340. Moreover, i is a positive integer, greater than or equal to 1, and describes the number of processing paths. In addition, H is a k×n matrix. $C_i$ is an encoded series, and describes a 1×n matrix.

Next, an explanation is given concerning the first de-interleaver 332. The first de-interleaver 332 combines encoded series outputted from each of the multipliers 340, performs sort processing, and outputs parity series. This sort processing is performed using a sorting rule used by the first interleaver 330. However, even with the same sorting rule, the sorting processing itself is different from the first interleaver 330. Specifically, if the sorting rule is (0, 1, 2, 3, 4, 5, 6, 7) and the series outputted from the multiplier 340 are, respectively, (d0, d2, d4, d6) and (d1, d3, d5, d7), the output series of the first de-interleaver 332 is (d0, d1, d2, d3, d4, d5, d6, d7). That is, the sorting can be done so that in cases where there is no multiplier 340, sort processing is not carried out. In other words, the first de-interleaver 332 performs processing the reverse of the first interleaver 330. Here, the number of processing paths and the sorting rule are decided in consideration of the localization of the burst errors included in the signal series, or the linear dependency held by the matrix H, described below. Details are given below.

Next, an explanation will be given concerning the multiplexer 334. The multiplexer 334 performs processing to combine the input data series and the parity series outputted by the first de-interleaver 332. This combining is done by connecting the parity series at the rear stage of the input data series. For example, in cases where the input data series is d0 to d100, and the parity series is p0 to p7, the output series of the multiplexer 334 is a series with d0 at the head of the data and p7 at the end of the data, as shown in Equation (5).

(d0, d1, . . . d99, d100, p0, p1, . . . , p7) Equation (5)

Figure 4:
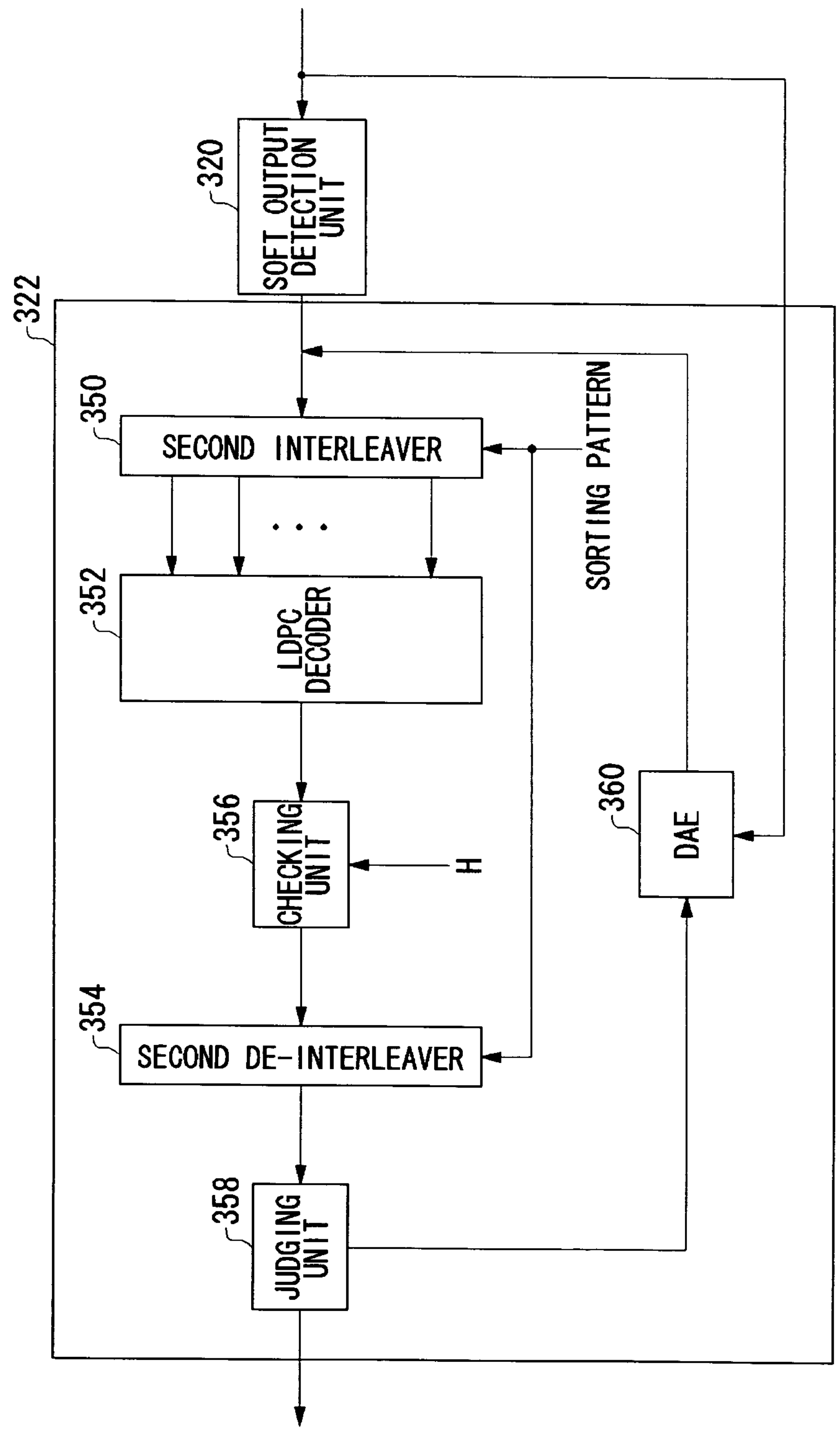
FIG. 4. is a view showing a configuration of the LDPC iteration decoder and the soft detection unit of FIG. 2.

Here, a detailed explanation is given concerning the LDPC iteration decoder 322. FIG. 4 is a view showing a configuration of the LDPC iteration decoder 322 and the soft detection unit 320 of FIG. 2. The LDPC iteration decoder 322 includes a second interleaver 350 for performing interleave processing on a signal series outputted from the soft output detection unit 320; an LDPC decoder 352 for implementing LDPC decoding processing on a signal that has undergone interleave processing; a checking unit 356 for checking that an error has been corrected by the LDPC decoder 352; a second de-interleaver 354 for performing sort processing the reverse of the second interleaver 350, on a signal that has been LDPC decoded; a judging unit 358 for judging whether to carry out iteration processing again; and a digital likelihood detection equalizer 360 (Digital Aided Equalizer; abbreviated to "DAE 360" below) for computing a soft decision value again, in cases in which iteration decoding is carried out, and giving feedback to a front stage of the second interleaver 350.

The soft output detection unit 320 is composed of a SOVA or the like, and outputs a soft decision value. For example, a soft decision value of (0.71, 0.18, 0.45, 0.45, 0.9) is outputted as output of the SOVA. These are numerical values that express whether the probability of 0 is large, and whether the probability of 1 is large. For example, the first value of 0.71 indicates that the probability of 1 is large, and the fourth value of 0.45 means that the probability of 0 is large but the probability of 1 is also not small. Output of a conventional Viterbi detector is a hard decision value, and is a hard decision of the SOVA output. In the case of the abovementioned example, this is (1, 0, 0, 0, 1). The hard decision value is only expressed as being 0, or as being 1, and information indicating which has a higher probability is lost. As a result, with input of the soft decision value to the LDPC iteration decoder 322, decoding performance improves.

The second interleaver 350 uses the sorting rule to perform sort processing of data outputted from the soft output detection unit 320. The specific operation is the same as for the first interleaver 330, and the explanation is omitted here.

The LDPC decoder 352 uses the matrix H to obtain a priori probability and a posteriori probability of a data series outputted from the second interleaver 350, and outputs a soft decision value that is a decoding result.

The checking unit 356 multiplies a decoded data series decoded by the LDPC decoder 352 by a transpose of the matrix H, and if the result thereof is a zero matrix, it is judged that the error has been corrected, iteration decoding is not carried out in the rear stage judging unit 358, and processing to output the data is performed. On the other hand, if the result of multiplying a transpose of the matrix H is not the zero matrix, the checking unit 356 judges that the errors have not been completely corrected. In cases in which the errors have not been corrected, the decoded data series before the hard decision and the decoded parity series are outputted to the DAE 360, by the judging unit 358 in the rear stage.

The second de-interleaver 354 used the sorting rule to perform sort processing the reverse of the second interleaver 350 on the soft decision value outputted from the checking unit 356. The specific operation is the same as for the first de-interleaver 332, and the explanation is omitted here.

In this way, by having a configuration in which the second interleaver 350 and the second de-interleaver 354 are arranged before and after the LDPC decoder 352, without any refinement of the matrix H, but rather by a refinement of the order of the data series, it is possible to solve the problem of the abovementioned linear dependency and the burst errors at the same time. Specifically, by sorting places where errors are concentrated, signals in which errors are included can be dispersed. Furthermore, error correction ability when decoding can be improved. Furthermore, by changing the order of the signal series, it is possible to allow a prescribed matrix to include a plurality of columns that are linearly dependent. In other words, it is possible to improve the error correction ability, without depending on characteristics of the prescribed matrix.

Here, a detailed description will be given concerning linear dependency using FIG. 5. FIG. 5 is a view showing an example of a case in which the matrix H related to the embodiment of the present invention has linearly dependent relationships. The matrix including a plurality of columns that have a linear dependency is one in which, for several columns included in the matrix, an exclusive-OR operation of each element included in these columns is performed, and the result thereof is a zero matrix. For example, where a column a, a column b, and a column c included in the matrix H have elements shown in FIG. 5, for each row thereof, the exclusive-OR operation is known to result in 0. A problem here is that there are cases in which errors are included in data Xa, Xb, and Xc, that are multiplied by the column a, the column b, and the column c, respectively. Judgment of this error is performed by the checking unit 356, described below, using Equation (6). Here, X is taken as a data column including data Xa, Xb, and Xc, and $H^T$ is a transpose matrix of H.

$$x \cdot H^T = (\cdots, x_a \cdots, x_b \cdots, x_c \cdots) \begin{pmatrix} \vdots & \vdots & \vdots & \vdots & \vdots \\ 1 & 0 & 1 & 1 & 0 \\ \vdots & \vdots & \vdots & \vdots & \vdots \\ 0 & 1 & 0 & 1 & 1 \\ \vdots & \vdots & \vdots & \vdots & \vdots \\ 1 & 1 & 1 & 0 & 1 \\ \vdots & \vdots & \vdots & \vdots & \vdots \end{pmatrix} \quad \text{Equation (6)}$$

As shown in Equation (6), in cases in which there is a linearly dependent relationship in 3 columns, among data Xa, Xb, and Xc that are multiplied thereby, if there is an error in any one or two of these data, it is possible to correct the error by repeating processing of the abovementioned LDPC decoder 352. However, in cases in which an error is included in all of the data Xa, Xb, and Xc, that is, in all data corresponding to columns in which there is a linearly dependent relationship, even if the processing of the abovementioned LCPD decoder 352 is repeated many times, these errors cannot be corrected.

Here, cases in which all of the data Xa, Xb, and Xc have errors is considered. In these cases, since correction cannot be done as it is, it is necessary to interchange columns in which there are linearly dependent relationships with other columns, or to interchange any of the data with data in which there is no error. However, as mentioned above, with regard to each element included in the matrix H, there is often a state in which the number of 1s is very small in comparison to the number of 0s, and there are linearly dependent relationships also in other columns. Accordingly, rather than interchanging columns of the matrix H, it is more preferable to interchange the data itself.

As described above, it is known that errors are generated locally in groups, and so-called burst errors exist in the data series itself, and furthermore it is known that there is localization in the burst errors. Localization of the burst errors means that, among the data, there is a constant tendency with regard to positions at which the burst errors exist.

Accordingly, in the embodiment of the present invention, in consideration of the linear dependency of the matrix H, or the localization and continuity of the burst errors, by interchanging the order of the data, even if columns having a linear dependent relationship are included in the H matrix, a configuration is made that can address the burst errors.

As a specific method of interchanging the order of the data, the depth of the interleaving may be made greater than the number of data in which burst errors are generated, in the second interleaver 350, and, having this lower than the number of input signal series may additionally be considered. Here, the depth of the interleaving may be the number of the processing paths, or may be the length of the sorting rule. Moreover, in consideration of the localization of the burst errors, places where the burst error are generated may be interchanged with data of places where the burst errors do not occur.

Here, an explanation is given using an example. In cases in which the input data X of the second interleaver 350 is (Xd, Xa, Xe, Xb, Xf, Xc), and there is a tendency for the burst errors to exist in the second to the fourth bits, Xa, Xe, and Xb, interchanging such as, for example, (Xa, Xd, Xe, Xf, Xc, Xb) may be carried out. At this time, Xa, Xe, and Xb, in which an error is included, are arranged every 1 bit, respectively, and since this may be said to be a random error, it is possible to make a correction by the LDPC decoder 352. The sorting rule for this case is (1, 0, 2, 4, 5, 3).

Furthermore, as another method, focusing on the linear dependent relationships, at least one item of data among multiplied data, in a plurality of columns that have linearly dependent relationships, may be interchanged with data in which a burst error has not been generated. In this case, by the interchanging, since at least one item of data does not include an error, even if an error is included in other data corresponding to columns in which there are linearly dependent relationships, by repeating the processing of the abovementioned LDPC decoder 352, it is possible to correct the error. In other words, when the H matrix is decided, a sorting rule may be decided so that columns in which there is a linearly dependent relationship are searched for, and data corresponding to these columns are dispersed.

A specific explanation is now given. Here, as shown in FIG. 5, cases are considered in which a matrix H including a column a, a column b, and a column c having a linearly dependent relationship, is used as a checking matrix. Moreover, as shown in Equation (6), there is a tendency for an error to be included in Xa, Xb, and Xc that are respectively multiplied by the column a, the column b, and the column c. In these cases, one of any of Xa, Xb, and Xc may be interchanged with data outside of Xa, Xb, and Xc, included in X. If X is assumed to be (Xd, Xa, Xe, Xb, Xf, Xc) Xa and Xd may be interchanged, for example, to give (Xa, Xd, Xe, Xb, Xf, Xc). The sorting rule at this time is (1, 0, 2, 3, 4, 5).

Next, an explanation will be given concerning the judging unit 358. When the judging unit 358 judges that a predetermined number of times has been reached, or that an error is no longer included, it makes a hard decision of a likelihood obtained at that time, and performs processing for outputting two value decoded data. Here, the hard decision indicates, for example, judging "1" for cases in which a value is larger than a prescribed threshold value, and judging "0" for cases in which it is smaller. Here, the output data of the second de-interleaver 354 includes a decoded data series and a decoded parity series. Moreover, the judgment unit 358, based on a check result of the checking unit 356, outputs a data series that is interchanged in the second de-interleaver 354, as it is, or outputs a decoded parity series and decoded data series before the hard decision to the DAE 360.

The DAE 360 computes again a priori probability and a posteriori probability, gives feedback to an input stage of the second interleaver 350, and performs iteration decoding. After that, the error is corrected, or iteration is carried out until a prescribed number of iterations has been done. On the other hand, if the error is corrected, or if the prescribed number of iterations has been done, a hard decision of the decoded data series only is made and output is performed. Repeated processing is halted at the prescribed number of times because it impedes high speed access.

According to the present embodiment, by sorting places where errors are concentrated, signals in which errors are included can be dispersed, and it is possible to improve error correction ability of the low parity check decoder. Furthermore, by changing the order of the signal series, it is possible to allow a prescribed matrix to include a plurality of columns that are linearly dependent. In other words, it is possible to improve the error correction ability, without depending on characteristics of the prescribed matrix. Furthermore, it is possible to realize access control of the storage system at higher speeds. Since it is not necessary to install extra hardware, a small-scale semiconductor integrated circuit can be realized.

In the present embodiment, an explanation has been given of dispersing burst errors by performing interleaving in the LDPC iteration decoder 322. However, there is no limitation thereto, and by performing interleaving in the same way, in the LDPC encoder 304, the burst errors may be dispersed. Moreover, by performing further interleaving in the LDPC encoder 304, and by performing de-interleaving corresponding to the interleaving of the LDPC encoder 304, in the LDPC iteration decoder 322, the burst errors may be dispersed.

Furthermore, in the present embodiment, an explanation has been given in which the LDPC encoder 304 and the LDPC iteration decoder 322 are arranged in the storage device. However, there is no limitation thereto, and the invention can be applied to applications in which the LDPC encoding or the LDPC decoding is carried out. For example, arrangement of the invention in a mobile terminal or in a base station can be considered. In these cases, a part in which error correction encoding is executed on a transmission side of the mobile terminal may be the LDPC encoder 304. In addition, a part in which the error correction decoding is executed on a receiving side of the base station may be the LDPC iteration decoder 322. Moreover, a part in which error correction encoding is executed on a transmission side of the base station may be the LDPC encoder 304. In addition, a part in which the error correction decoding is executed on the receiving side of the mobile terminal may be the LDPC iteration decoder 322. By additionally performing the interleaving on any one LDPC encoder 304, and by performing the de-interleaving corresponding to the interleaving of the LDPC encoder 304, on another LDPC iteration decoder 322, the burst errors may be dispersed.

An explanation of the present invention based on the embodiments has been given above. These embodiments are examples; various modified examples of combinations of the embodiments, or of combinations of various component elements or various processes thereof are possible, and a person skilled in the art may understand that such modified examples are also within the scope of the present invention.

What is claimed is:

1. A signal decoder comprising:

an interleaving circuit for sorting an order of an input signal series of a prescribed number of signals;

a low density parity check decoder for performing low density parity check decoding, using a prescribed matrix, on the signal series sorted by the interleaving circuit; and a de-interleaving circuit for sorting an order of signals outputted from the low density parity check decoder; wherein the prescribed matrix is a matrix for checking a low density parity series, and a logical sum of elements of M columns, M being an integer greater than or equal to 2, included in the matrix gives a zero matrix;

wherein the interleaving circuit sorts at least one signal, by interchanging with another signal, among the signals acted upon relating to respective columns, with the logical sum of the M columns, M being an integer greater than or equal to 2, being a zero matrix, by the low density parity check decoder.

2. A signal decoder according to claim 1, wherein the interleaving circuit has an increased number of processing paths, and by sorting the input signal series, the number M is decreased.

3. A storage system, having a signal storage system comprising a write channel for writing data to a storage device, and a read channel for reading data stored in the storage device, wherein the write channel comprises:

a first encoder for run-length encoding of data;

a second encoder for encoding data encoded by the first encoder, using a low density parity check code; and a writing unit for writing the data encoded by the second encoder, to the storage device; and the read channel comprises:

a soft output detection unit for calculating likelihood for data read from the storage unit and outputting a soft decision value;

a first decoder, corresponding to the second encoder, for decoding data outputted from the soft output detection unit; and a second decoder, corresponding to the first encoder, for decoding the data decoded by the first decoder; and the first decoder comprises:

an interleaving circuit for sorting an order of the data outputted from the soft output detection unit;

a low density parity check decoder for performing low density parity check decoding on a signal series sorted by the interleaving circuit; and a de-interleaving circuit for sorting an order of a signal outputted from the low density parity check decoder; wherein a rule for sorting in the interleaving circuit is decided based on an error generation model for the data outputted from the soft output detection unit.

4. A storage system according to claim 3 further comprising:

a storage device for storing data; and a controller for controlling writing to the storage device and reading from the storage device; wherein the read channel, in accordance with an instruction of the controller, reads data stored in the storage device, and the write channel, in accordance with an instruction of the controller, writes encoded data to the storage device.

5. A signal decoding method comprising:

sorting an order of an input signal series of a prescribed number of signals with an interleaving circuit;

performing low density parity check decoding with a low density parity check decoder, using a prescribed matrix, on the signal series; and sorting an order of signals outputted from the low density parity check decoding step with a de-interleaving circuit; wherein the prescribed matrix is a matrix for checking a low density parity series, and a logical sum of elements of M columns, M being an integer greater than or equal to 2, included in the matrix gives a zero matrix;

wherein the interleaving circuit sorts at least one signal, by interchanging with another signal, among the signals acted upon relating to respective columns, with the logical sum of the M columns, M being an integer greater than or equal to 2, being a zero matrix, by the low density parity check decoder.

* * * * *